United States Patent
Buechel

(10) Patent No.: US 7,868,246 B2
(45) Date of Patent: Jan. 11, 2011

(54) SOLAR CELL MODULE AND METHOD OF ENCAPSULATING SAME

(75) Inventor: Arthur Buechel, Ruggell (LI)

(73) Assignee: Oerlikon Solar AG, Trubbach (CH)

( * ) Notice: Subject to any disclaimer, the term of this patent is extended or adjusted under 35 U.S.C. 154(b) by 173 days.

(21) Appl. No.: 11/279,152

(22) Filed: Apr. 10, 2006

(65) Prior Publication Data
US 2006/0225777 A1 Oct. 12, 2006

Related U.S. Application Data

(60) Provisional application No. 60/670,538, filed on Apr. 11, 2005.

(51) Int. Cl.
*H01L 25/00* (2006.01)
*H01L 31/00* (2006.01)

(52) U.S. Cl. ............................. 136/251; 136/244

(58) Field of Classification Search ............. 136/251, 136/244
See application file for complete search history.

(56) References Cited

U.S. PATENT DOCUMENTS

| 4,388,483 A * | 6/1983 | Basol et al. ............. 136/260 |
| 4,697,041 A * | 9/1987 | Okaniwa et al. ......... 136/244 |
| 4,726,849 A * | 2/1988 | Murata et al. ............ 136/244 |
| 4,981,525 A * | 1/1991 | Kiyama et al. .......... 136/244 |
| 5,512,107 A * | 4/1996 | van den Berg ........... 136/251 |
| 5,578,141 A * | 11/1996 | Mori et al. ............... 136/251 |
| 5,582,653 A * | 12/1996 | Kataoka et al. .......... 136/251 |
| 5,800,631 A * | 9/1998 | Yamada et al. ........... 136/251 |
| 5,977,476 A * | 11/1999 | Guha et al. ............... 136/249 |
| 6,034,323 A * | 3/2000 | Yamada et al. ........... 136/259 |
| 6,051,778 A * | 4/2000 | Ichinose et al. .......... 136/256 |
| 6,113,718 A * | 9/2000 | Yamada et al. ............. 156/78 |
| 6,437,235 B1 * | 8/2002 | Komori et al. .......... 136/251 |
| 6,501,014 B1 * | 12/2002 | Kubota et al. ........... 136/256 |
| 6,515,216 B2 * | 2/2003 | Zenko et al. ............. 136/244 |
| 6,525,264 B2 * | 2/2003 | Ouchida et al. ......... 136/246 |
| 2001/0020486 A1 * | 9/2001 | Tsuge ..................... 136/251 |
| 2002/0079060 A1 * | 6/2002 | Kondoh .................. 156/443 |
| 2003/0010377 A1 | 1/2003 | Fukuda |
| 2003/0178056 A1 | 9/2003 | Hikosaka |
| 2004/0112423 A1 * | 6/2004 | Suzuki et al. ............ 136/256 |
| 2005/0133083 A1 * | 6/2005 | Matsushita et al. ....... 136/251 |

OTHER PUBLICATIONS

Patent Abstracts of Japan vol. 2000, No. 19, Jun. 5, 2001 & JP 2001 044476 A (Canon Inc), Feb. 16, 2001: the whole document.
Patent Abstracts of Japan vol. 2002, No. 09, Sep. 4, 2002 & JP 2002 134770 A (Toppan Printing Co Ltd), May 10, 2002: the whole document.

* cited by examiner

*Primary Examiner*—Alexa D Neckel
*Assistant Examiner*—Golam Mowla
(74) *Attorney, Agent, or Firm*—Pearne & Gordon LLP

(57) ABSTRACT

A composite solar collection module includes a thin film solar collection cell that is encapsulated between a transparent substrate, such as glass, on one side, and an electrically insulating film on the other. A metallic layer is disposed over the electrically insulating film to provide protection against diffusion of atmospheric species that may harm the thin film solar collection cell. The insulating and metallic layers are dimensioned so that a larger collection cell can be used to collect solar energy over a larger proportion of the available substrate surface area, without causing arcing between the cell edge and the metallic layer edge.

21 Claims, 5 Drawing Sheets

SOLAR CELL MODULE AND METHOD OF ENCAPSULATING SAME

This application claims the benefit of U.S. provisional application Ser. No. 60/670,538 filed Apr. 11, 2005, the contents of which are incorporated herein by reference in their entirety.

BACKGROUND OF THE INVENTION

Encapsulation is critical to the lifetime of solar cells, especially thin film solar cells. Commonly used encapsulation methods (Glass/TF-Cell/PVB/Glass) or Glass/TF-cell/EVA/Tedlar/Al) show a considerable amount of moisture and/or oxygen permeation, mainly from the edges of the solar cell through the EVA/PVB lamination material. The amount of diffusing species depends on the PVB or EVA area (thickness of the encapsulation material film times perimeter of the module) directly exposed to the atmosphere. Consequently a thick PVB or EVA layer results in a high permeation probability, raising the amount on humidity and/or oxygen within the encapsulated area. The gases permeated through the encapsulation material may be harmful to some TF cell materials. In particular boron-doped ZnO, used as a transparent conductive layer, is moisture sensitive and may be severely lifetime limited in case standard encapsulation is used.

As a consequence, module manufacturers are using stable thin film materials like $SnO_2$. These materials are the best choice regarding cell stability. However, this may not be in line with the best choice for overall cell performance. For example the moisture sensitive ZnO transparent electrode material increases the cell performance, especially the light trapping behavior (see J. Mueller in Solar Energy 77 (2004) p. 917 or J. Meier et al at Orlando Solar Energy Conference 2005 proceedings (2005)). Due to the limiting isolation qualities of the encapsulation material, this superior transparent electrode material is not used, to avoid degradation of the cell when exposed to humidity.

FIGS. 1a and 1b show currently used encapsulation schemes for a TF cell in a solar collection module 100. The TF cell 20 is encapsulated between a transparent substrate 10 at the front and an encapsulation material 30 (EVA or PVB) and a back protection 40 at the back. This back protection 40 may be glass 41 or a polymeric material 42. In case a polymeric foil 42 is used, an additional metal layer 43 attached to the polymeric foil is needed to limit the diffusion through the polymeric foil. Currently, rather thick polymeric foils or layers (up to several mm) are used and the metal film is directly laminated on the polymeric foil. The metal film and the polymeric foil are provided having flush edges, and need to be attached to the glass substrate. Attachment to the substrate can be accomplished by lamination or a gluing process. Tedlar is the material of choice for the polymeric foil mentioned above since it is very stable against environmental conditions. However other foil materials may be used.

A more sophisticated approach in encapsulating a thin film solar cell 20 with non-glass alternatives is the use of a back protection 40 comprising a metal sealing foil 60 as shown in FIG. 2. The mostly polymer foil 50 is used as a dielectric material and a mechanical protection while the metal foil 60 is used as a diffusion barrier for environmental gases like oxygen or water vapor. For industrial use the metal and the polymer foil 60 and 50 are attached to each other mostly by gluing, with the metal and polymer foil having flush edges. Laminating this specific back protection 40 to the glass substrate 10, as shown in FIG. 2, results in a solar module 100 with reduced moisture permeation. However this encapsulation technique has the major drawback of arcing problems.

The arcing results from leak current which is flowing from the metal edge of the multilayer foil (edge of foil 50/60) to the grounded metal frame 90 or any surrounding ground potential. Modern, transformer-less DC/AC converters switch the polarity of the modules to convert to AC voltage more efficiently. The TF-cell 20 and the back protection 40 with the metal layer 60 represent a capacitor in respect to this switching. As a consequence, the voltage on the metal edge follows the voltage of the TF-cell 20. Since the metal 60 foil is charged now, arcing to ground potential (for example the module frame) is possible and will most likely occur during humid conditions. This arcing not only damages the encapsulation foil but also causes severe problems to the DC/AC converters.

The currently available encapsulation scheme limits the module design to materials which are not moisture and/or oxygen sensitive. For example, currently, thin film module manufacturers are using $SnO_2$ for transparent electrodes. ZnO with a high haze factor would be an alternative. However this material is more moisture sensitive. The use of this rough ZnO would also enable new cell designs. Microcrystalline p-layers are usually deposited in a reducing atmosphere which is capable of reducing $SnO_2$ to native tin. This reaction reduces the transparency of the $SnO_2$ front contact. As a consequence the cell performance is lowered. In contrast, ZnO does not show this behavior when exposed to reducing plasmas during player deposition, allowing the direct deposition of a microcrystalline player on the transparent electrode.

Similarly a moisture/air permeation barrier will give the flexibility for a lot of other alternative cell designs like alternative back reflectors made from ZnO/Al or NIP cells. The currently applied scheme as shown in FIG. 1 uses rather thick layer of EVA or PVB. Both materials show some moisture/air diffusion. To protect the TF cell design, the distance between the module edge 15 and the TF cell should be as big as possible. On the other hand the dead area between the edge 15 and the TF cell 20 is basically reducing the power of the module. As a consequence the overall value of the deposited glass plate is lowered by this unused area.

In general glass plate based encapsulation schemes add extra weight to the module. As long as the module area is small this is not a major concern. As soon as the glass size is exceeding the 1 $m^2$ area the module weights increase above 10 kg depending on the glass thickness. Adding the weight of the encapsulation glass to this weight may require the usage of special mounting tools like cranes or other lifting devices for mounting the module. The increased weight of the module 100 due to the glass back plate also influences the supporting structure of the module at the end-user side.

As a consequence (FIG. 1b), instead of a glass based back side also polymeric (plastic) foil 42 based cell covers (back protection 40) are used. These schemes usually need a metal foil 43 on top of the plastic material to achieve reasonable moisture/air permeation values. In case this design is used other problems must be considered. For example modern module and solar cell technology is alternating the current in the DC/AC converter changing the current on the module frequently. These current changes charge the metal back foil 43 causing arcs between the metal foil 43 and the frame 90 holding the solar module 100. These arcs may cause the total loss of the solar module 100. As a consequence, the encapsulation must be set in a distance to the metal frame 90. So a distance between the frame 90 and the encapsulated area is provided, which increases the distance between the glass edge 15 and that of the energy collecting material (TF cell 20). Correspondingly, the fraction of TF cell area on the glass substrate 20 is reduced causing a loss in active area on the solar cell module 100.

Current back foil 60,50 approaches are using a combination of foil-metal-Tedlar® for encapsulating thin film cells. The final Tedlar® foil is mostly used for weather and environmental protection and rather highly priced. Alternative final encapsulation materials would be highly appreciated by industry.

Nevertheless the main problems in solar cell encapsulations arise on the edge 15 of the module 100. There the encapsulation-substrate interface is highly vulnerable to adhesion problems. Moisture/air creeping through capillary effects on this interface may show up destroying the performance of the cell. Such capillary effects may be enhanced by insufficient cleaning of the interface to be bonded or by adhesion problems due to improper cleaning or handling of the glass, the back foil or the glue.

SUMMARY OF THE INVENTION

A composite solar collection module includes a substrate, a thin film solar cell, an insulating film and a metallic layer. The substrate is transparent to solar rays and has a substrate perimeter edge. The thin film solar cell is disposed adjacent the substrate for the collection of solar rays transmitted through the substrate, and has a cell perimeter edge. The electrically insulating film is disposed over the thin film solar cell opposite the substrate, and has an insulating perimeter edge. The metallic layer is disposed over the insulating film opposite the thin film solar cell, and has a metallic perimeter edge. The metallic perimeter edge is recessed inward from both the substrate perimeter edge and the insulating perimeter edge. The metallic perimeter edge also is at least coextensive with the cell perimeter edge.

DETAILED DESCRIPTION OF PREFERRED EMBODIMENTS OF THE INVENTION

As used herein, the following abbreviations have the following meanings:
TF cell: Thin film cell
PVB: Polyvinylbutyral
EVA: Ethyl Vinyl Acetate
Tedlar®: Polyvinylfluoride foil from Dupont
PVC: Polyvinyl chloride
PE: Polyethylene
PMMA: Polymethylmetacrylic Acid (Plexiglas)
NIP: refers to the following laminate TF cell structure: n-doped silicon layer—intrinsic silicon layer—p-doped silicon layer
PIN: refers to the following laminate TF cell structure: p-doped silicon layer—intrinsic silicon layer—n-doped silicon layer Also as used herein, a composite solar collection module refers to a generally laminate structure wherein individual elements of the module are provided as layers or films in a layered or 'stacked' fashion. Each element in the module has a substantially planar expanse that terminates in a perimeter edge for that element, and a thickness that is measured in a direction perpendicular to the planar expanse of the element, such that the thickness of the entire composite module is equal to the sum of the thicknesses of all of the individual elements thereof. By 'planar expanse,' it is not meant that each of the elements must be flat and planar; elements having curved surfaces also may be used, in which case the resulting solar collection module will have a correspondingly curved surface shape.

Figure 1A:
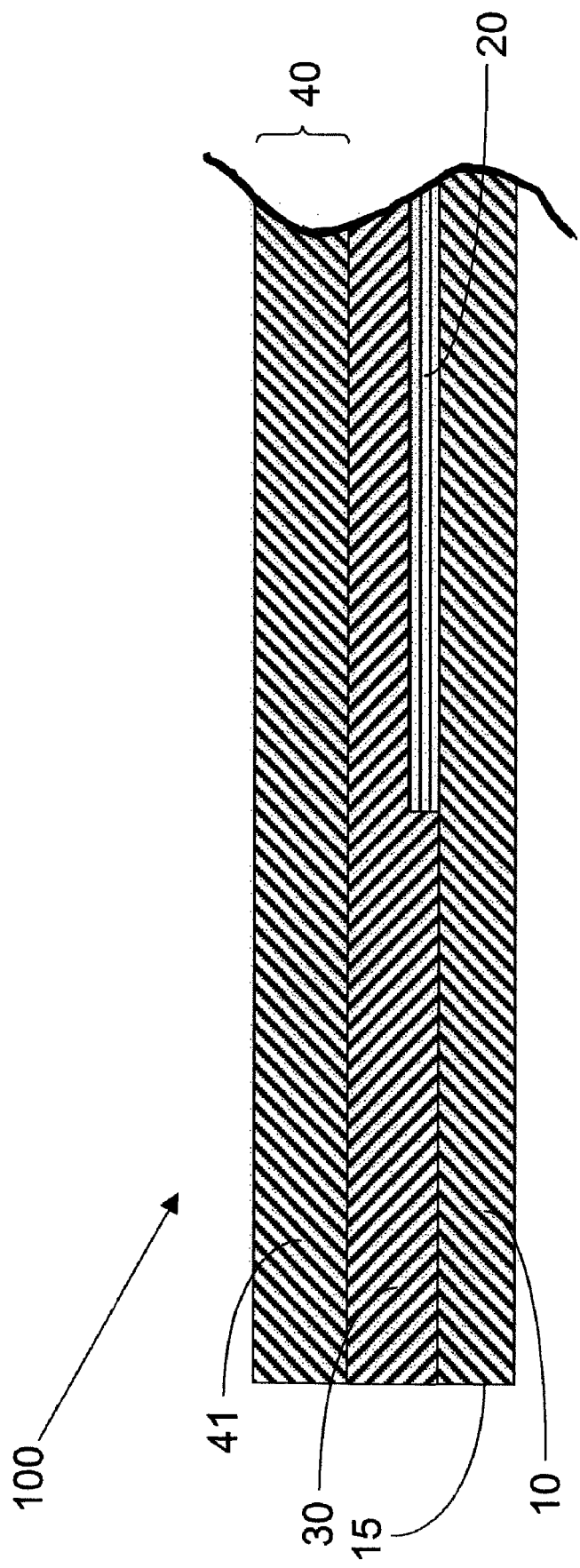
FIGS. 1a and 1b show side cross-sectional views of traditional solar cell encapsulation structures.
Figure 1B:
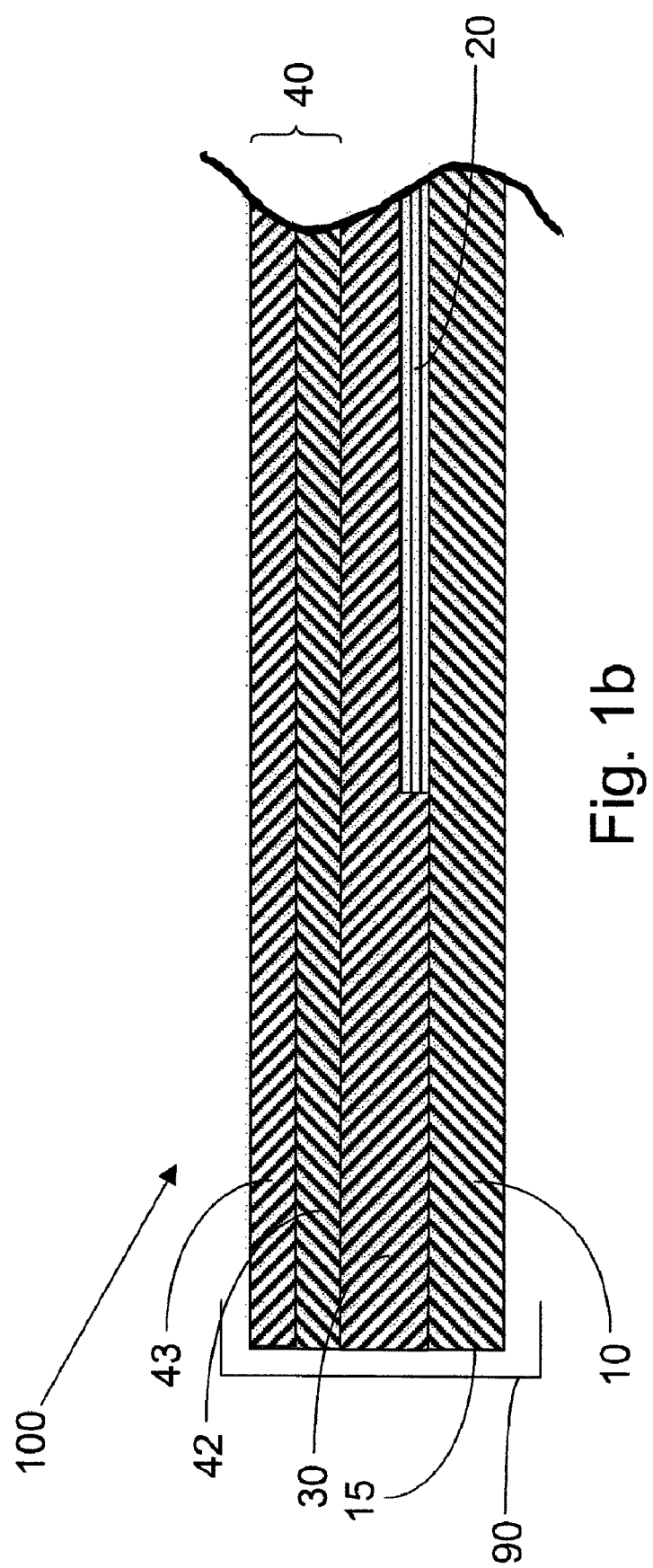
Figure 2:
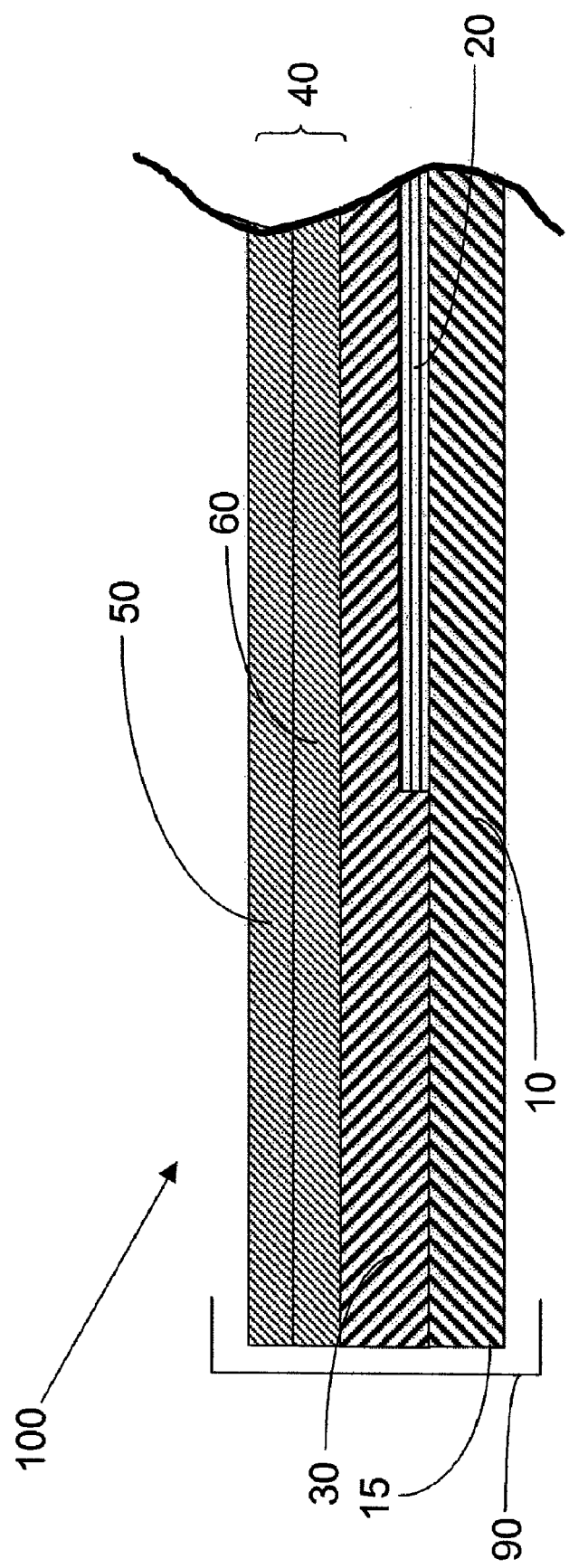
FIG. 2 shows a current design of a solar cell encapsulation structure employing a back protection foil.
Figure 3A:
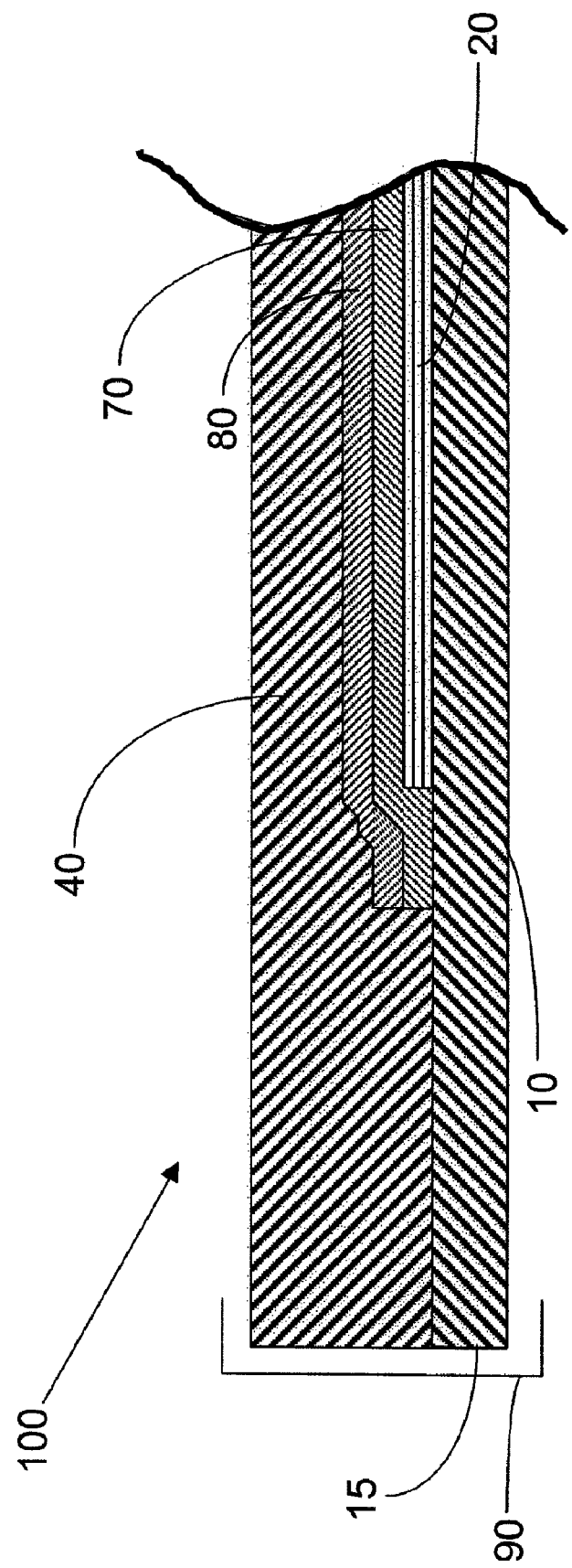
FIG. 3a shows a side cross-sectional view of a further solar cell encapsulation structure.

The disclosed invention addresses the problems mentioned above by applying an encapsulation scheme as shown in FIG. 3. A thin insulating film 70 is applied on top of the TF cell 20. On top of this film 70 another film 80 made from a metallic material is deposited to provide a permeation barrier against moisture or oxygen. Finally, a mechanical and electrical protection 40 is applied on top the metal film for a complete encapsulation assembly.

The first very thin insulating film closest to the TF cell 20 is an electrical insulating film 70. In contrast to the prior art this film 70 is only a fraction of the thickness compared to typical EVA and PVB embedding materials 30 and therefore the moisture permeation laterally from the edge of the module to the cell can be reduced to less than 10% compared to EVA or PVD embedding materials 30.

Preferably the film 70 can be spun, rolled or spray coated over the substrate 10 covered by the TF cell 20. A large variety of organic and inorganic materials can be used. For example, resins as they are used for circuit board coating would be a very good choice since they are commercially available and show good behavior regarding electrical insulation. The final thickness of the organic film depends on:

a) Film 70 material: Base requirement is to form a electrical insulating film. So the organic film has to be continuous and show acceptable thickness uniformity. For example PMMA is one candidate material. However, depending on the quality and deposition method the required thickness may vary. Assuming a high grade material with a low bubble density, a 1 µm film is sufficient. A low grade material may be less expensive, however may require more thickness since the bubble and void density is high and an arc path between the TF cell and the top metal film is possible. At least a film thickness of >1 µm is recommended in this case, for example thicknesses up to 10 µm or 20 µm could be used depending on factors such as the bubble and void density. As pointed out the bubble and void density is important. Consequently, the deposition method is essential to determine the film thickness. For example, spray coated films show a higher void and bubble density as well as a lower uniformity than spin coated films. The material used for the organic film is not limited to a single choice. Instead of using an organic film, an inorganic film may be used (see, e.g., U.S. Pat. No. 6,407,329).

b) Electrical properties: The insulating film 70 has to have a conductivity low enough that the electrical properties of the module (Fill factor, Voltage and Current) are not affected negatively.

In general the insulating film 70 is optimized by the following criteria:

a) optimized materials in terms of electrical properties, and environmental stability b) known industrialized and automated processes for application.

Since the film thickness is low, the diffusion cross section of the insulating film 70 to the atmosphere is low as well, reducing the air and moisture exchange nearly to zero. On top of this insulating film 70 a metal layer 80 is deposited. The metal layer 80 can be, e.g., Al, Cu, and is put directly onto the insulating film 70. The TF cell 20 is embedded in the metallic layer 80 and completely protected from the environment. The total metal coverage can be reached by several approaches. However, since metals show a very low permeability to all TF layer-relevant gases only thin layers of metal are needed. Consequently a few (e.g. 2-3) nanometer thick up to one or two micron thick layers are applied. Our experiments have shown that a 100 nm thick aluminum film can provide sufficient sealing capabilities. However, it has to be pointed out that the layer thickness of the metal films 80 strongly depends on the metal used as well as on the film quality obtained. In general the metal film 80 should be continuous and the same safety margin should be applied before defining the final film thickness. A method of choice for film deposition would be sputtering, which allows fast and homogeneous deposition of such thin layers at an acceptable price.

Figure 3B:
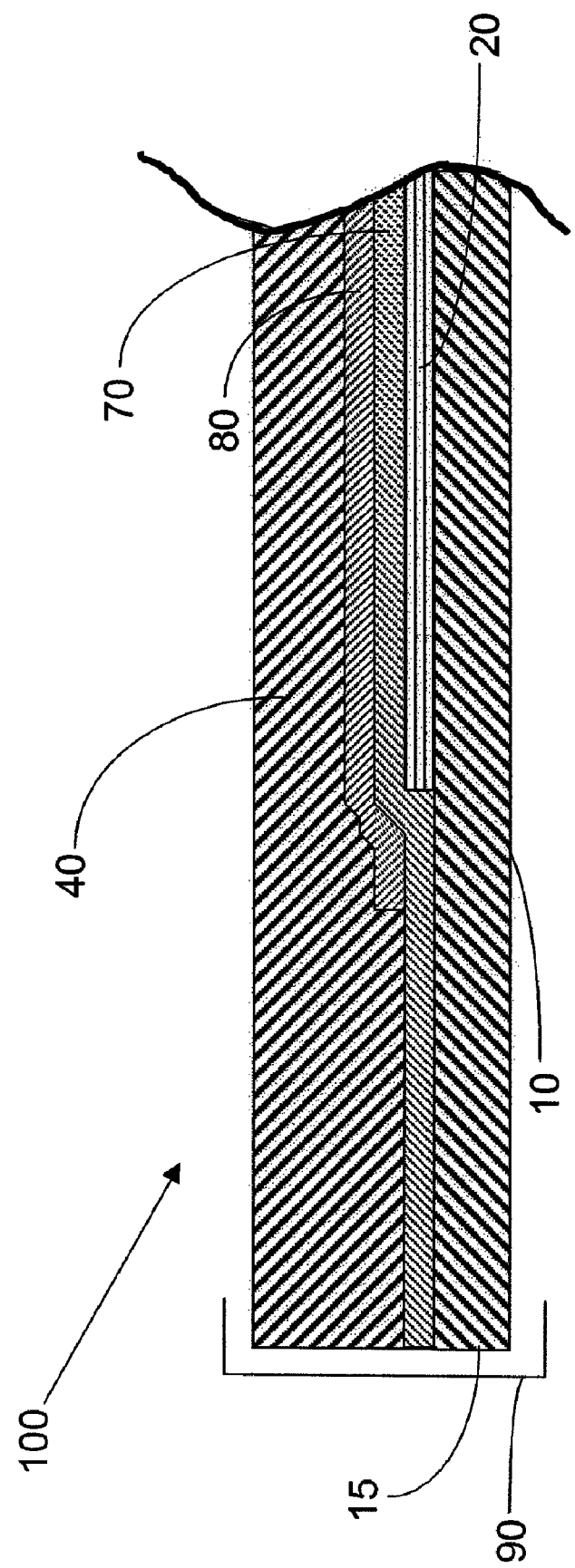
FIG. 3b shows a side cross-sectional view of a solar cell encapsulation structure according to an embodiment of the invention.

As shown in the embodiment of FIG. 3b, already the metal film 80 does not have to be aligned to the insulating film 70. That is, the edge of the metal film 80 needs not be flush or co-extensive with the edge of the insulating film 70. Instead, the metal film 80 is recessed from the edge 15 of the module 100 (and also from the metal frame 90 that encases the module 100) a greater distance than the insulating film 70 located between the metal film 80 and the TF cell 20. In the illustrated embodiment, the metal film 80 is recessed a distance from the module edge 15, while the insulating film 70 extends all the way to the module edge 15. This arrangement allows a recess of the metal film 80 to the glass edge 15 and the metal frame 90 holding the solar cell module. The gap between the metal frame 90 and the metal film 80 is large enough and at the same time the distance between the TF cell 20 and metal film 80 is sufficient to avoid arcing issues. This allows a much higher glass utilization by the energy generating TF cell area than within prior art arrangements. A comparison of FIG. 3b with FIG. 3a will illustrate this benefit in more detail. In case of FIG. 3a a recess between the metal protection film 80 and the glass (module) edge 15 is necessary which consumes about 5-15 mm glass area measured from the module edge 15. After that distance the metal/foil arrangement starts which is necessary for the air/moisture tight sealing. In the embodiment of this invention illustrated in FIG. 3b, the insulating film 70 is approaching the glass edge 15 while only the metal film 80 is recessed. This allows the metal film 80 edge to be located closer to the TF cell 20, for example 0-4 mm, because the insulating layer 70 extends far enough beyond their respective edges that an electrical arc cannot jump between them around the edge of the insulating layer 70. So in the illustrated embodiment the TF cell 20 extends nearer to the edge 15 of the glass substrate 10 (module) by about 15 mm. Assuming a glass (module) size of 1100×1300 mm$^2$ and calculating the resulting additional surface area due to an additional 15 mm extension of the TF cell 20 about its entire perimeter, the active TF area will increase from about 1.35 m$^2$ to about 1.39 m$^2$ which is 2.6%.

On top of one or more layers of insulating film 70 and metal film 80 a mechanical and electrical protection layer 40 is applied. This mechanical protection layer 40 protects the thin film assembly from mechanical harm like cuts during the mounting of a solar panel or mechanical weather effects. In contrast to the prior art this layer 40 does not need to show any gas permeability characteristic. As a consequence rather low budget materials can be used in contrast to the currently used Tedlar® foils. The disclosed encapsulation will allow a very stable insulation of the TF cell 20 against the exposure of atmospheric gases. As a consequence moisture sensitive TF cell materials may be used. One of these preferable materials would be boron-doped ZnO, which is a viable candidate TCO (transparent conductive oxide) material for cells with high efficiency.

Several advantages can be achieved based on the foregoing disclosure:

1. Very stable encapsulation, virtually no shift when exposed to humidity and/or higher temperature, extended life time.
2. Materials such as ZnO deposited with LP-CVD (low pressure chemical vapor deposition) method can be applied as a front TOO resulting in a higher cell performance.
3. Materials such as Ag can be used as back reflector material enhancing the cell efficiency and reducing cost.
4. Materials such as ZnO deposited at low temperature can be used a back contact in conjunction with a white reflector.
5. Due to reduced permeation, distance from module edge to the TF cell can be reduced increasing the cell aperture and the power per module.
6. Because no metal layer is exposed or close to a metal frame, no risk of arcing or parasitic discharges exists.

Also, due to the increased gas insulation, NIP solar cells may be possible. Insulation may be used for all cases where thin film cells must be protected against moisture or atmospheric gases.

Although the invention has been described with respect to certain embodiments, it is to be understood that various modifications and alterations can be made thereto by a person having ordinary skill in the art without undue experimentation, and without departing from the spirit and the scope of the invention as set forth in the appended claims.

What is claimed is:

1. A composite solar collection module comprising:
   a substrate that is transparent to solar rays, said substrate having a substrate perimeter edge;
   a thin film solar cell disposed adjacent said substrate for the collection of solar rays transmitted through said substrate, said thin film solar cell having a cell perimeter edge;
   an electrically insulating film applied directly on top of said thin film solar cell opposite said substrate and having an insulating perimeter edge; and
   a metallic layer deposited directly onto said insulating film opposite said thin film solar cell and having a metallic perimeter edge;
   said metallic perimeter edge being recessed inward from both said substrate perimeter edge and said insulating perimeter edge, said metallic perimeter edge also being at least coextensive with said cell perimeter edge.

2. A solar collection module according to claim 1, said metallic perimeter edge being coextensive with said cell perimeter edge.

3. A solar collection module according to claim 1, said insulating perimeter edge being coextensive with said substrate perimeter edge.

4. A solar collection module according to claim 1, said metallic layer extending 0 to 4 mm beyond said cell perimeter edge toward said substrate perimeter edge.

5. A solar collection module according to claim 4, said insulating perimeter edge being coextensive with said substrate perimeter edge.

6. A solar collection module according to claim 4, said metallic perimeter edge being recessed 5 to 15 mm inward from said substrate perimeter edge.

7. A solar collection module according to claim 5, said metallic perimeter edge being recessed 5 to 15 mm inward from said substrate perimeter edge.

8. A solar collection module according to claim 1, further comprising a mechanical protection layer disposed over said metallic layer opposite said insulating film, said mechanical protection layer being coextensive with said substrate.

9. A solar collection module according to claim 8, said substrate being made from glass, said mechanical protection layer being made from a material selected from the group consisting of glass and polymeric materials.

10. A solar collection module according to claim 1, said solar cell having a PIN structure.

11. A solar collection module according to claim 1, said solar cell having a NIP structure.

12. A solar collection module according to claim 1, said solar cell comprising a boron-doped ZnO transparent conductive layer.

13. A solar collection module according to claim 1, said electrically insulating film being made from PMMA.

14. A solar collection module according to claim 1, said metallic layer having a thickness of 2 nm to 2 μm.

15. A solar collection module according to claim 14, said metallic layer having a thickness of about 100 nm.

16. A solar collection module according to claim 15, said metallic layer being an aluminum film.

17. A solar collection module according to claim 1, said substrate having dimensions of 1100 mm×1300 mm thereby defining a substrate perimeter edge that is 4800 mm long, said metallic perimeter edge being recessed 5 to 15 mm inward from said substrate perimeter edge, and said cell perimeter edge being recessed 5 to 19 mm inward from said substrate perimeter edge.

18. A solar collection module according to claim 17, said electrically insulating film having a thickness of 1 μm to 10 μm, said metallic layer having a thickness of 2 nm to 2 μm.

19. A solar collection module according claim 1, said thin film solar cell being in direct contact with said substrate.

20. A solar collection module according to claim 1, wherein said electrically insulating film is applied only on one side of said thin film solar cell.

21. A solar collection module according to claim 1, said electrically insulating film having a thickness of 1 μm to 10 μm.

* * * * *

UNITED STATES PATENT AND TRADEMARK OFFICE
CERTIFICATE OF CORRECTION

PATENT NO. : 7,868,246 B2
APPLICATION NO. : 11/279152
DATED : January 11, 2011
INVENTOR(S) : Arthur Buechel Page 1 of 1

It is certified that error appears in the above-identified patent and that said Letters Patent is hereby corrected as shown below:

In the specification, column 2, line 30, replace the word "player" with -- p-layer --

In the specification, column 6, line 17, replace the word "TOO" with --TCO --

Signed and Sealed this
Twenty-sixth Day of April, 2011

David J. Kappos
*Director of the United States Patent and Trademark Office*